United States Patent [19]
Hale

[11] Patent Number: 5,986,827
[45] Date of Patent: Nov. 16, 1999

[54] PRECISION TIP-TILT-PISTON ACTUATOR THAT PROVIDES EXACT CONSTRAINT

[75] Inventor: Layton C. Hale, Livermore, Calif.

[73] Assignee: The Regents of the University of California, Oakland, Calif.

[21] Appl. No.: 09/098,693

[22] Filed: Jun. 17, 1998

[51] Int. Cl.$^6$ ........................................................ G02B 7/02
[52] U.S. Cl. ............................................ 359/822; 359/819
[58] Field of Search .................................... 359/819, 822; 369/44.15, 44.22

[56] References Cited

U.S. PATENT DOCUMENTS 5,383,168  1/1995  O'Brien et al. ...................... 369/44.14

*Primary Examiner*—Scott J. Sugarman
*Assistant Examiner*—Ricky Mack
*Attorney, Agent, or Firm*—L. E. Carnahan

[57] ABSTRACT

A precision device which can precisely actuate three degrees of freedom of an optic mount, commonly referred to as tip, tilt, and piston. The device consists of three identical flexure mechanisms, an optic mount to be supported and positioned, a structure that supports the flexure mechanisms, and three commercially available linear actuators. The advantages of the precision device is in the arrangement of the constraints offered by the flexure mechanism and not in the particular design of the flexure mechanisms, as other types of mechanisms could be substituted. Each flexure mechanism constrains two degrees of freedom in the plane of the mechanisms and one direction is actuated. All other degrees of freedom are free to move within the range of flexure mechanisms. Typically, three flexure mechanisms are equally spaced in angle about to optic mount and arranged so that each actuated degree of freedom is perpendicular to the plane formed by the optic mount. This arrangement exactly constrains the optic mount and allows arbitrary actuated movement of the plane within the range of the flexure mechanisms. Each flexure mechanism provides a mechanical advantage, typically on the order of 5:1, between the commercially available actuator and the functional point on the optic mount. This improves resolution by the same ratio and stiffness by the square of the ratio.

19 Claims, 6 Drawing Sheets

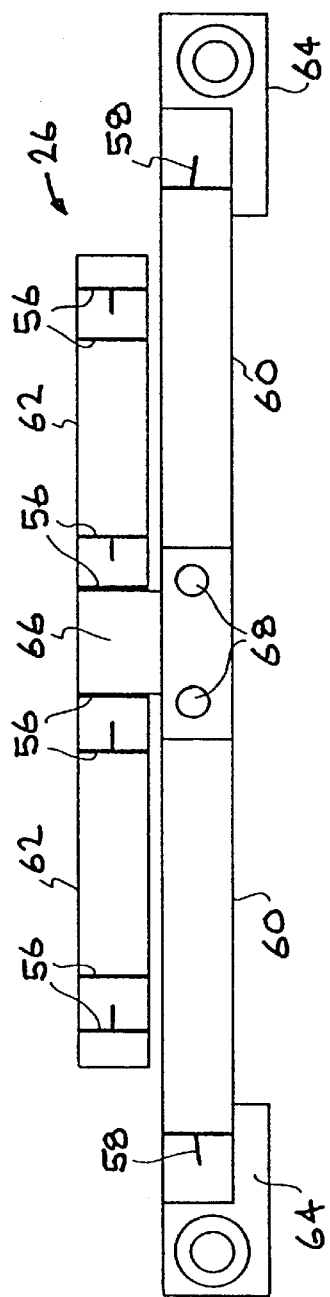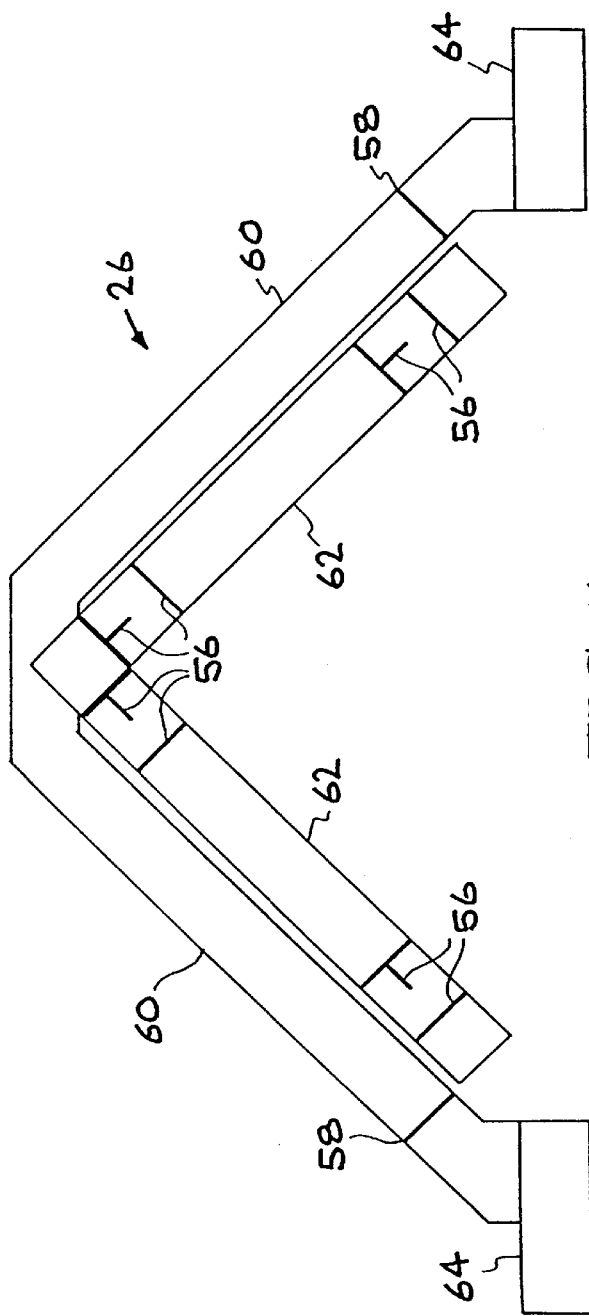
FIG. 4
FIG. 5

PRECISION TIP-TILT-PISTON ACTUATOR THAT PROVIDES EXACT CONSTRAINT

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to optic mounts, particularly to optical mounts having means for adjustment about X, Y and Z axes, and more particularly to an actuator that can precisely actuate three degrees of freedom of a suspended component, such as an optic mount, commonly referred to as tip, tilt, and piston, while also providing exact constraint.

Optics for use in imaging system, such as extreme ultraviolet lithography (EUVL), require reflective optics that are precisely figured to the Angstrom level. This requirement is expanding the state of the art in optics manufacturing and in opto-mechanical system design. There is a need in the art to position precisely and remotely the optical surface in three degrees of freedom, commonly referred to as tip, tilt, and piston. Quite often these degrees of freedom are provided serially as two independent rotations about X and Y axes and an independent translation along the Z axis, which is perpendicular to the optical surface. However, for the precision required by imaging systems, such as EUVL, it is difficult or perhaps impossible to obtain sufficient rigidity and dimensional stability in a serial mechanism.

The present invention addresses the particular challenge to position precisely and remotely the optical surface in tip, tilt and piston (three degrees of freedom). The invention belongs to the class of parallel-link mechanisms, which offer significant advantages at the complication of coordinated axis moves, which is not at all significant for tip, tilt and piston. Besides being stiffer, parallel-link mechanisms provide exact constraint for the suspended element (optical surface). This is important for an optic mount since overconstraint can negatively influence the figure of the optic.

The precise motions and long term dimensional stability required for EUVL naturally favor the use of blade flexures, rather than ball joints and hinges, which function as simple hinge joints but without friction and backlash. Frequently, flexure mechanisms are designed to provide mechanical advantage for more precise actuation. This invention incorporates mechanical advantage into each flexure mechanism with one extra hinge axis. Basically, the precision tip-tilt-piston actuator of this invention consists of three flexure mechanisms, an optic mount to be supported and positioned, a structure that supports the flexure mechanisms, and three commercially available linear actuators. Blade flexures are used as simple hinge joints in the flexure mechanisms because they operate without friction and backlash.

SUMMARY OF THE INVENTION

It is an object of the present invention to provide a precision actuator for a suspended component, such as an optic mount.

A further object of the invention is to provide a precision actuator to precisely actuate three degrees of freedom of an optic mount.

A further object of the invention is to provide a precision tip, tilt, and piston actuator that provides exact constraint.

Another object of the invention is to provide an actuator for an optic mount utilizing three equally spaced flexure mechanisms, each flexure mechanism constrains two degrees of freedom in the plane of the flexure and one direction is actuated, which exactly constrains the optic mount and allows arbitrary actuated movement of the plane within the range of the flexure mechanisms.

Another object of the invention is to provide a precision tip-tilt-piston actuator for an optic mount that typically consists of three identical equally spaced flexure mechanisms, an optic mount to be supported and positioned, a structure for supporting the flexure mechanisms, and three conventional linear actuators.

Another object of the invention is to provide a precision three degrees of freedom actuator for an optic mount typically utilizing three equally spaced flexure mechanisms and three linear actuators, which provides an arrangement of constrains and wherein each flexure mechanism provides a mechanical advantage or ratio on the order of 5:1 between the linear actuator and a functional point on the optic mount, which improves resolution by the same ratio and the equivalent stiffness of the actuator by the square of the ratio.

Other objects and advantages of the present invention will become apparent from the following description and accompanying drawings. Basically, the invention is a precision tip-tilt-piston (three degrees of freedom) actuator for suspended components, such as an optic mount that provides exact constraint. The precision actuator includes a support structure, an optic mount to be supported and positioned, three identical flexure mechanisms mounted on the support structure, and three linear actuators mounted on the support structure and operatively mounted to the flexure mechanisms. This actuator addresses the need to precisely actuate three degrees of freedom of the optic mount. The invention lies in the arrangement of the constraints offered by the flexure mechanisms. The invention basically belongs to the class of parallel-link mechanisms which offer significant advantages at the complication of coordinated axis moves. Also, besides being stiffer, parallel-link mechanisms provide exact constraint for the suspended element, such as an optic mount. This is important for an optic mount since over constraint can negatively influence the figure of the optic mounted thereon. The flexure mechanisms of this invention utilizes blade flexures, which function as simple hinge joints, but without friction and backlash, and the invention incorporates mechanical advantage into each flexure mechanism with one extra hinge axis. Thus, this invention provides the precise motions and long-term dimensional stability required for imaging systems, such as the extreme ultraviolet lithography (EUVL) system, or other optical systems requiring precision tip-tilt-piston adjustment of an optic in an exact-constraint mount.

BRIEF DESCRIPTION OF THE DRAWINGS

The accompanying drawings, which are incorporated into and form a part of the disclosure, illustrate an embodiment of the invention and, together with the description, serve to explain the principles of the invention.

FIGS. 4 and 5 are top and side views of a first flexure member of each flexure mechanism.

DETAILED DESCRIPTION OF THE INVENTION

Figure 1:
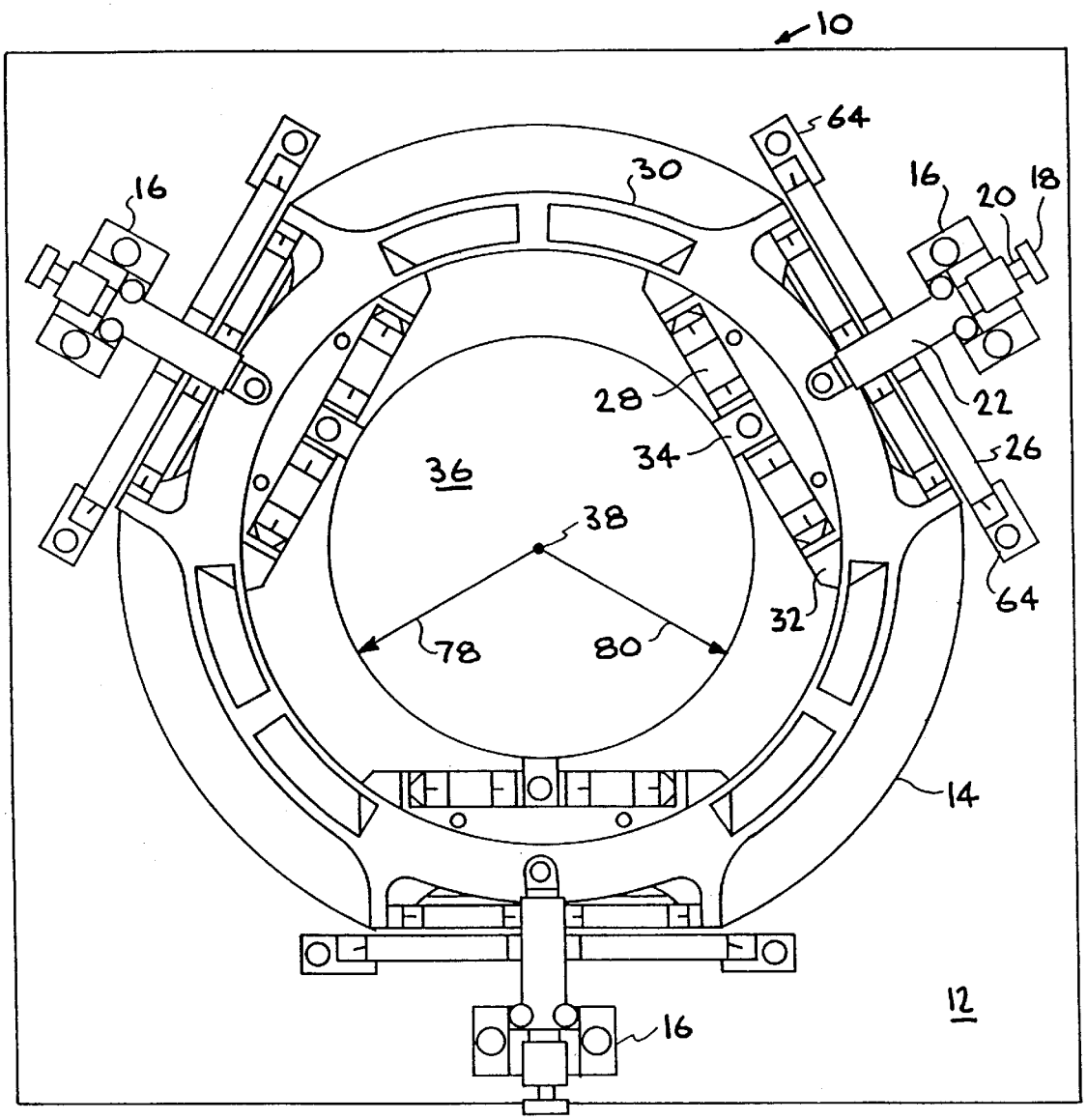
FIG. 1 is an overall top view of an embodiment of the tip-tilt-piston actuator of the present invention.

The present invention addresses the need to precisely actuate three degrees of freedom of an optic mount, commonly referred to as tip, tilt, and piston. The invention encompasses a precision tip-tilt-piston actuator for optic mounts or other suspended components that provides exact constraint. The provision of exact constraint is important for an optic mount since over constraint can negatively influence the figure of the optic. While the invention is described herein for use with an optic mount, it can be utilized for other suspended components.

The precision actuator, as illustrated in the drawings, consists of three flexure mechanisms, an optic mount to be supported and positioned, a structure that supports the flexure mechanisms, and three commercially available linear actuators. The three flexure mechanisms, each powered by a linear actuator, provide the ability to precisely position the optic mount in three degrees of freedom, commonly referred to as tip, tilt, and piston. The remaining three degrees of freedom are passively constrained by the flexure mechanisms. Blade flexures are used as simple hinge joints in the mechanism because they operate without friction and backlash. Other types of bearing, e.g., ball joints and hinges, could be substituted to build the same basic mechanism.

To define the motion of tip, tilt, and piston, consider a coordinate system with orthogonal X, Y, and Z axes. Piston is defined as translation along the Z axis. Tip and tilt refer to rotations about fixed perpendicular axes in the X-Y plane, where small angle assumptions are made to simplify the description of angular motion. For purposes of this invention, it is not necessary to use a precise description of angular motion. To define the motion actually produced by the actuator of this invention, consider three points that lie in the X-Y plane and are typically equally spaced (but not necessarily) around a circle centered at the origin. Each flexure mechanism lies at its respective point in the X-Y plane, passively constrains motion tangent to the circle and actively controls the Z position. Equal Z motion at each flexure mechanism produces the same Z motion (or piston) at the optic mount. Differential motion in the proper proportion can achieve rotation that is equal to the vector sum of required tip and tilt motion.

Each flexure mechanism consists of a pair of single-constraint flexures arranged in a vee to constrain translation in the plane of the vee. The angle of the vee is typically 90° to provide equal stiffness in all directions of the plane, but 105° is another logical choice to provide equal stiffness in all directions of the optic mount (for three flexure mechanisms equally spaced in angle). The three flexure mechanisms, typically spaced equally in angle about the optic mount, combine to constrain all six rigid-body degrees of freedom of the optic mount. This three-vee arrangement of single constrains is typical for precision optics mounts. Each flexure mechanism of the invention contains an additional hinge axis that is offset from and parallel to the plane of the vee constraints, as shown in the drawings. The hinge axis is also parallel to the X-Y plane with an offset that depends on the design intent. An angular rotation of this hinge axis produces the desired Z displacement of the flexure mechanism.

Angular rotation of the hinge axis is accomplished by the linear actuator acting on an arbitrarily long lever arm to achieve the desired mechanical advantage with respect to the offset of the hinge, typically of order 5:1. This improves resolution by the same ratio and stiffness by the square of the ratio. Typically, the hinge axis must be rigid in two planes, as provided by a cross-blade flexure, but a special arrangement allows the use of a simple blade flexure. The drawings show this arrangement. The blade of the flexure hinge lies in the plane defined by the hinge axis and the intersection of the vee constraint. Ideally the linear actuator should operate through the same intersection.

Figure 2:
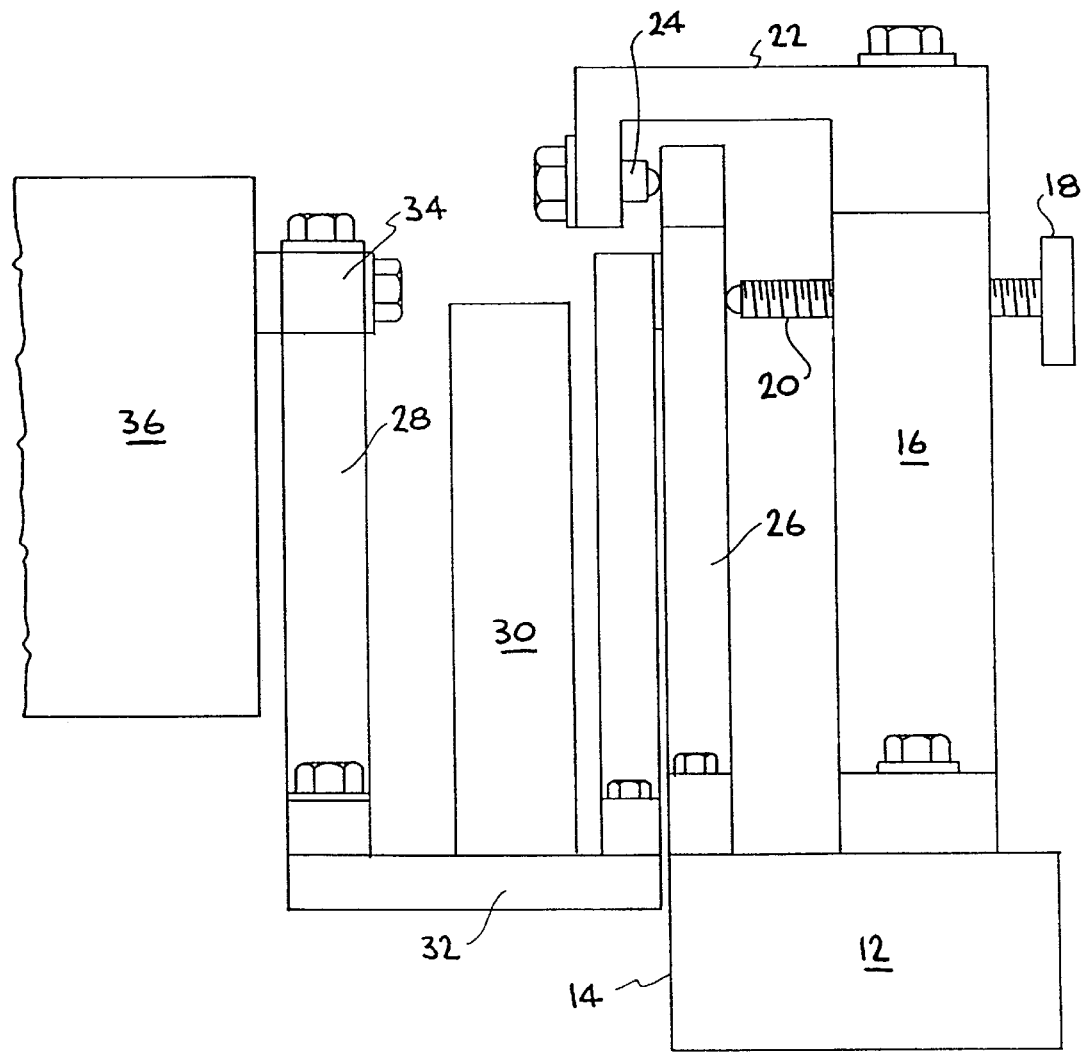
FIG. 2 is a side view of one of the three flexure mechanisms/linear actuators of the FIG. 1 embodiment.

Referring now to the drawings, FIG. 1 is a top view of an embodiment of the precision actuator and FIG. 2 is a side view of one of the three equally spaced actuator mechanisms of FIG. 1. The tip-tilt-piston (TTP) actuator is generally indicated at 10 and includes a base or support plate 12 having an opening 14, with three commercially available push-pull (linear) actuators 16 equally positioned around opening 14. Each linear actuator 16 is secured to base plate 12, as by bolts, and includes an actuator adjustment knob 18, an adjustment screw 20 and a spring plunger mount 22, as seen in FIG. 2, a spring plunger 24 keep a first flexure member or bar 26 of a flexure mechanism pressed against the adjustment screw 20. Each of three equally spaced flexure mechanism include, as shown in FIGS. 1 and 2, the first flexure 26, a second flexure 28, a stiffening ring 30, a flexure link plate 32, and a mounting boss 34 which connects second flexure 28 to a workpiece (optical mount) 36 mounted as a payload on ring 30 having a vertical axis (Z) indicated at 38.

Figure 3A:
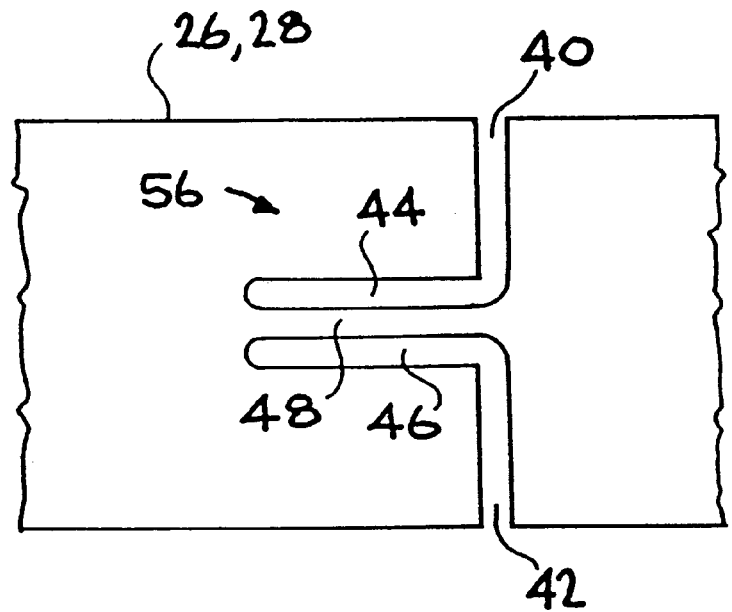
FIGS. 3A and 3B illustrate cuts made in the flexure bars of FIGS. 1 and 2.
Figure 3B:
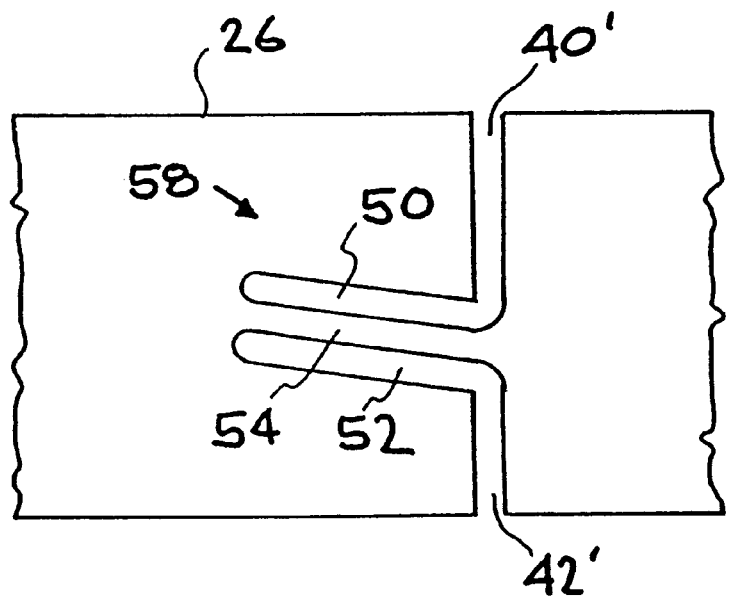

FIGS. 3A and 3B illustrate cuts made in the flexure bars. Each of the flexure members or bars 26 and 28, as shown in FIG. 3A includes cuts into the bars indicated at 40 and 42 which interconnect with cuts 44 and 46 to form a center flex blade 48, while as shown in FIG. 3B, flexure bar 26 additionally includes cuts 40' and 42' connected to angle cuts 50 and 52 to form an angled flex blade 54, so as to produce a straight flex indicated at line 56 and an angled flex indicated at line 58.

FIGS. 4 and 5 illustrate top and side views of the first flexure member or bar 26, and illustrating the straight flex lines 56 and the angled flex lines 58 as described above with respect to FIGS. 3A–3B. The flexure bar 26 includes primary flexure legs 60 and secondary flexure legs 62, with primary flexure legs 60 having mounting feet 64 which are secured, as by bolts, to base plate 12, as seen in FIG. 1. Primary flexure legs 60 and secondary flexure legs 62 are interconnected by a member 66 on legs 62.

Figure 6:
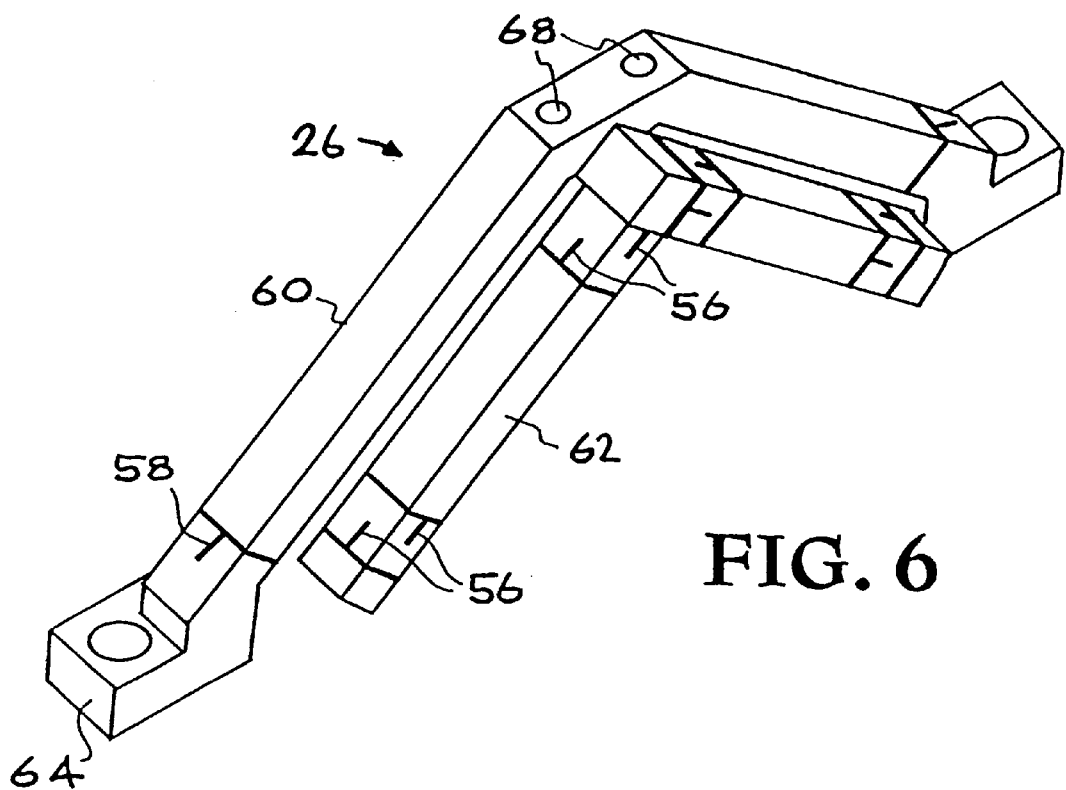
FIG. 6 is an isometric view of one of the flexure mechanisms of FIG. 1.
Figure 7:
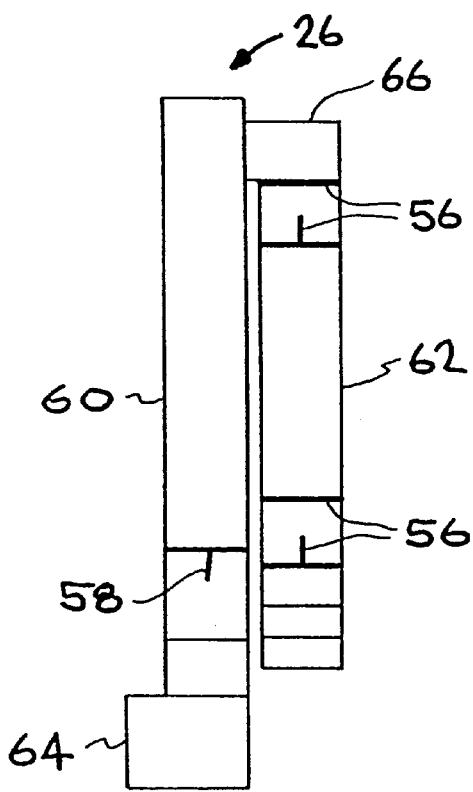
FIG. 7 is a side view of the flexure mechanism of FIG. 6.

FIGS. 6 and 7 are isometric and side views of the flexure member or bar 26 of FIGS. 4–5 and include corresponding reference numerals.

Figure 8:
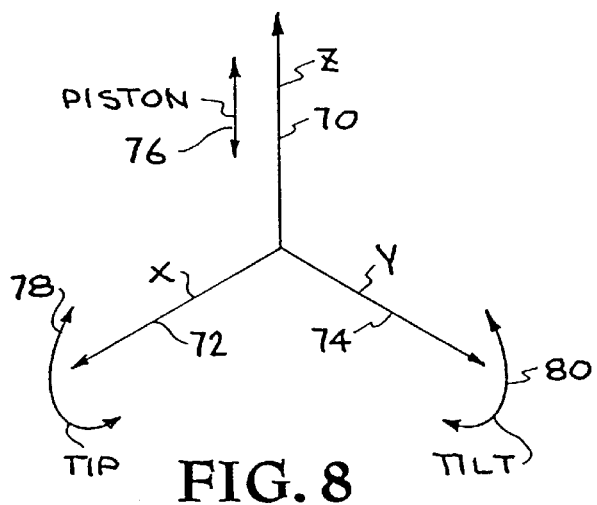
FIG. 8 shows the three axes of movement of the actuator of FIG. 1.

FIG. 8 shows the three axes of movement of the precision TTP actuator or FIG. 1. As shown the Z axis indicated by arrow 70 defines the piston movement on the vertical indicated by arrow 76 (axis indicated at 38 in FIG. 1). The X axis indicated by arrow 72 defines the tip movement as indicated by the arrow 78. The Y axis indicated by arrow 74 defines the tilt movement as indicated by the arrow 80.

Figure 9:
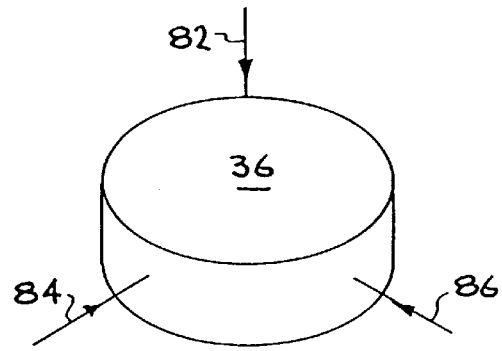
FIG. 9 shows a workpiece with actuator means indicated by the arrows.
Figure 10A:
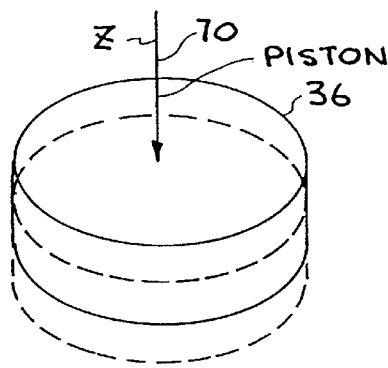
FIGS. 10A–10C illustrate the piston, tip, tilt movements of the workpiece of FIG. 9.
Figure 10B:
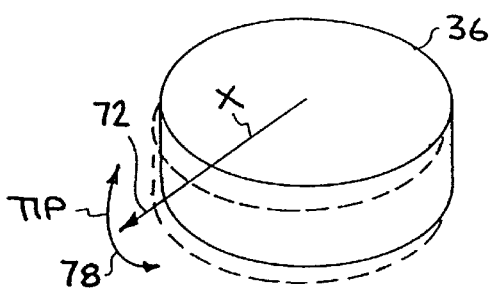
Figure 10C:
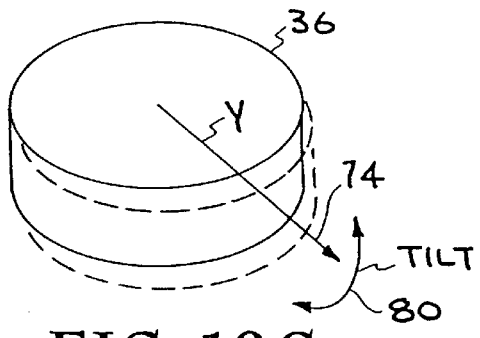
Figure 10D:
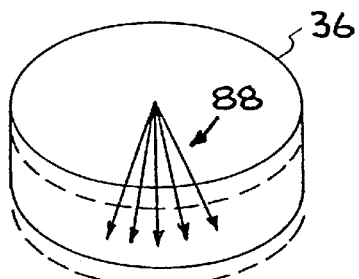
FIG. 10D illustrates movement of the workpiece of FIG. 9 with movement of any two of three flexure mechanism of FIG. 1.

FIG. 9 shows the workpiece (optical mount) 36 which is mounted inside ring 30 as the payload of FIG. 1 with three equally spaced actuator means (combined flexure mechanism/linear actuator) illustrated in FIG. 1 being indicated by arrows 82, 84 and 86.

FIGS. 10A to 10D illustrate movements of the workpiece 36 when one, two, or three of the actuator 82, 84, and 86 of FIG. 9 are activated. The mechanism is coupled, movement of just one actuator causes combined motion in tip-tilt-piston. It requires the right combination of actuation (at all three actuators) to produce pure tip, tilt or piston motion. For equally spaced actuators, 1 unit movement at one actuator produces ⅓ unit movement of the coordinate system in Z and ⅔r angular units of movement about Y. Thus, to achieve pure rotation about Y requires 1 unit movement up at actuator 1 and ½ unit movement down at actuators 2 and 3. To achieve pure rotation about X requires equal and opposite motion at actuators 2 and 3. This can be expressed as a matrix equation as follows:

$$A_1 = \delta_z - r\theta y$$

$$A_2 = \delta_z + \frac{\sqrt{3}}{2}r\theta x + \frac{1}{2}r\theta y$$

$$A_3 = \delta_z - \frac{\sqrt{3}}{2}r\theta x + \frac{1}{2}r\theta y$$

$$\begin{bmatrix} A_1 \\ A_2 \\ A_3 \end{bmatrix} = \begin{bmatrix} 1 & 0 & -r \\ 1 & \frac{\sqrt{3}}{2}r & \frac{1}{2}r \\ 1 & \frac{-\sqrt{3}}{2}r & \frac{1}{2}r \end{bmatrix} \begin{bmatrix} \delta_z \\ \theta_x \\ \theta_y \end{bmatrix}$$

As shown in FIGS. 10A to 10D all three actuators 82, 84 and 86 are selectively activated and the workpiece will move as shown in dotted lines, along lines 70, 72, 74 and 88.

It has thus been shown that the present invention addresses the need to precisely actuate three degrees of freedom of an optic mount or other workpiece, commonly referred to as tip, tilt and piston. The precision actuator typically consists of three identical equally spaced flexure mechanisms and three commercially available linear actuators mounted on a support structure and connected to the workpiece (optical mount) by which the workpiece is supported and positioned. The novel part of this precision actuator lies in the arrangement of the constraint offered by the flexure mechanisms, wherein each mechanism constrains two degrees of freedom in the plane of the flexures and one direction is actuated. All other degrees of freedom are free to move within the range of the flexures. Thus, this actuator exactly constrains the workpiece (optic mount) and allows arbitrary actuated movement of the plane within the range of the mechanisms. In addition, each flexure mechanism provides a mechanical advantage, typically of a ratio on the order of 5:1, between the linear actuator and the functional point on the optic mount, which improves resolution by the same ratio and the equivalent stiffness of the actuator by the square of the ratio.

While a particular embodiment of the invention has been described and illustrated to exemplify and explain the principles of the invention, and such is not intended to be limiting. Modifications and changes may become apparent to those skilled in the art, and it is intended that the invention be limited only the scope of the appended claims.

The invention claimed is:

1. A precision tip-tilt-piston actuator that provides exact constraint of a workpiece supported and positioned on the actuator, comprising:

a support member, a plurality of spaced flexure mechanisms, each including a stiffening ring, mounted to said support member and adapted to be connected to an associated workpiece, and a plurality of linear actuators mounted to said support member and operatively connected to said flexure mechanisms;

whereby movement of at least one of said linear actuators causes movement of an associated work piece in at least one of tip, tilt, and piston directions.

2. The actuator of claim 1, wherein said plurality of flexure mechanisms and said plurality of linear actuators consist of three equally spaced flexure mechanisms and three linear actuators equally spaced about an associated workpiece.

3. The actuator of claim 1, additionally including an optical mount which constitutes the associated workpiece.

4. The actuator of claim 1, wherein each of said plurality of flexure mechanisms comprises two interconnected flexure members, a first of said flexure members being connected to one of said linear actuators, a second of said flexure members being adapted to be connected to an associated workpiece.

5. The actuator of claim 4, wherein said stiffening ring of each of said plurality of flexure mechanisms is positioned intermediate said first and second flexure members.

6. The actuator of claim 5, additionally including a link plate interconnecting said first and second flexure members and said stiffening ring.

7. The actuator of claim 4, wherein one of said linear actuators operatively connected to said first of said flexure members includes an adjustable screw and a spring plunger positioned on opposite sides of said first flexure member.

8. The actuator of claim 1, wherein each of said linear actuators includes an adjustment means and a plunger means for contact with one of said flexure mechanisms.

9. The actuator of claim 4, wherein said first of said flexure members comprises two interconnected flexure bars, each of said flexure bars having two flexure legs, said flexure legs of a first of said flexure bars being secured to said support member, and said flexure legs of a second of said flexure bars being operatively connected to said second flexure member.

10. The actuator of claim 9, wherein each of said flexure legs of each of said flexure bars has cuts to define flex blades therein.

11. The actuator of claim 10, wherein each of said legs of said first flexure bar has an angled flex blade therein, and wherein each of said legs of said second flexure bar has straight flex blades therein.

12. An actuator for precisely actuating three degrees of freedom of an optic mount, comprising:

three identical flexure mechanisms mounted on a support structure and operatively connected to said optical mount for supporting and positioning said optical mount; and three identical linear actuators operatively connected to said flexure mechanisms and mounted on said support structure;

each of said three flexure mechanisms being spaced in angle about said optic mount and arranged so that each one of said three degrees of freedom is perpendicular to a plane formed by said optic mount, which exactly constrains said optic mount and allows arbitrary actuated movement of a plane within a range of said flexure mechanism.

13. The actuator of claim 12, wherein each of said flexure mechanism is equally spaced from another and is constructed to provide a mechanical advantage of about 5:1 between said linear actuator and a functional point on said optic mount.

14. The actuator of claim 13, wherein each of said three flexure mechanisms which include two interconnected flexure members, one of said two flexure members being connected to one of said linear actuators, another of said two flexure members being connected to said optic mount.

15. The actuator of claim 14, wherein said one of said two flexure members is composed of two interconnected flexure bars, one of said flexure bars being connected to said one linear actuator and mounted to said support structure, and another of said flexure bars being operatively connected to said another of said two flexure members.

16. The actuator of claim 15, wherein said one of said flexure bars include a pair of flexure legs having angled cuts therein to form angled flex blades, and wherein said another of said flexure bars includes a pair of flexure legs having straight cuts therein to form straight flex blades therein.

17. The actuator of claim 16, wherein said another of said flexure bars is connected to said another of said two flexure members via a link plate.

18. The actuator of claim 17, additionally including a stiffening ring intermediate said another of said flexure bars and said another of said two flexure members.

19. The actuator of claim 18, wherein each of said linear actuators includes an adjustable means and a spring plunger means, said one of said flexure bars being positioned intermediate said adjustable means and said spring plunger of said linear actuator.

* * * * *